United States Patent [19]

Vokey et al.

[11] Patent Number: 4,947,469
[45] Date of Patent: Aug. 7, 1990

[54] RESISTIVE FAULT LOCATION METHOD AND DEVICE FOR USE ON ELECTRICAL CABLES

[75] Inventors: David E. Vokey, Tolland, Conn.; Kenneth N. Sontag, Winnipeg, Canada; John C. Chamberlain, Worcester; Ronald L. Lavallee, Southbridge, both of Mass.

[73] Assignee: Automated Light Technologies, Inc., Southbridge, Mass.

[21] Appl. No.: 293,288

[22] Filed: Jan. 4, 1989

[30] Foreign Patent Document

Jan. 5, 1988 [GB] Great Britain ............ 8,800,081

[51] Int. Cl.5 .................................. G01R 31/08
[52] U.S. Cl. ........................ 324/523; 324/509; 324/527
[58] Field of Search ............... 324/522, 523, 525, 541, 324/544, 527, 524, 551, 509; 379/26

[56] References Cited

U.S. PATENT DOCUMENTS

| | | | |
|---|---|---|---|
| 3,248,646 | 4/1966 | Brazee | 324/525 X |
| 3,284,704 | 11/1966 | Lamont | 324/523 |
| 4,424,479 | 1/1984 | Brown | 324/525 |

Primary Examiner—Reinhard J. Eisenzopf
Assistant Examiner—Robert W. Mueller
Attorney, Agent, or Firm—Pennie & Edmonds

[57] ABSTRACT

A resistive fault in an electrical cable is located by applying a DC voltage to one end of the faulted cable conductor. The steady state DC voltage and current are measured at the end of the conductor where the voltage is applied. Simultaneously, the DC voltage is measured at the other end of the cable. The voltage is then reversed in polarity and the measurements repeated. Several repetitions of this procedure at each end of the conductor yields sufficient information to compute the location of the fault with reasonable accuracy. The procedure is carried out using two computer-based units, one at each end of the cable, with the two units communicating over the conductor under test.

15 Claims, 7 Drawing Sheets

RESISTIVE FAULT LOCATION METHOD AND DEVICE FOR USE ON ELECTRICAL CABLES

BACKGROUND OF THE INVENTION

Electrical cables, used for communication or power transmission, often develop faults between insulated conductors, insulated conductors and a metallic shield or armor, insulated conductor and earth, or metallic shield or armor and earth. These faults are usually as a result of damaged or deteriorated insulation which, in the presence of ground water, develop electrical faults. A further complication exists in that watercaused resistive faults are time and voltage variant. A conductor, which is partially shorted due to a water fault, will have a fault resistance which will vary with the applied voltage, the polarity of the applied voltage and with time as electrolysis changes the presence of ions and exposed conductor surface. This variable fault resistance is unpredictable and renders useless simple loop resistance methods.

Several instruments, employing various bridge techniques, are available to measure the electrical resistance of the conductor to the fault which can then be used to calculate the distance to the fault. The bridge measurement methods, particularly when the fault resistance is high relative to the conductor resistance, require a parallel conductor or pair of conductors, to "strap back" the far end of the faulted conductor to the arms of the measurement bridge. If non-faulted conductors are not available, then the bridge measurement methods are not possible.

Another fault location method uses a short electrical pulse which is transmitted down the faulted line. At the fault a portion of the transmitted energy is reflected back to the transmit end where it is detected. The time delay from the launch to return provides a distance estimate to the fault. This method is useful only on certain types of conductors and cannot easily detect high resistance faults.

The present invention relates to the provision of a method whereby the distance to a conductor fault may be determined without the inherent limitation of the previously known methods.

SUMMARY

According to one aspect of the present invention there is provided a method of locating a resistive fault between first and second ends of an electrical conductor, comprising:

(a) applying a DC voltage to the first end of the conductor;

(b) measuring the steady state DC voltage and current at the first end of the conductor and substantially simultaneously measuring the steady state DC voltage at the second end of the conductor;

(c) applying a DC voltage to the second end of the conductor;

(d) measuring the steady state DC voltage and current at the second end of the conductor and substantially simultaneously measuring the steady state DC voltage at the first end of the conductor;

(e) computing from the measured voltages and currents the resistance of the conductor between the resistive fault and at least one end of the conductor; and (f) computing the distance between the resistive fault and at least one end of the conductor from the computed conductor resistance.

According to another aspect of the present invention there is provided an apparatus for locating a resistive fault between first and second ends of an electrical conductor, comprising:

a first power supply for applying a DC voltage to the first end of the conductor;

first metering means for measuring the voltage of and current in the conductor at the first end;

a second power supply for applying a DC voltage to the second end of the conductor;

second metering means for measuring the voltage of and current in the conductor at the second end; and calculating means operatively connected to the first and second metering means for calculating from voltages and currents measured thereby, the resistance of the conductor between each end thereof and a fault therein, and for calculating the distance along the conductor from at least one end of the conductor to the fault.

Thus, the invention does not employ a bridge or signal reflection technique, but rather measurements of voltage and current at both ends of the faulted conductor. In preferred embodiments, a series of measurements, using sequential DC signals with opposite potential are carried out to correct for ground-induced errors, and to provide a statistical averaging of the measured quantities.

DESCRIPTION OF THE DRAWINGS

In the accompanying drawings, which illustrate exemplary embodiments of the invention.

DETAILED DESCRIPTION

Figure 1:
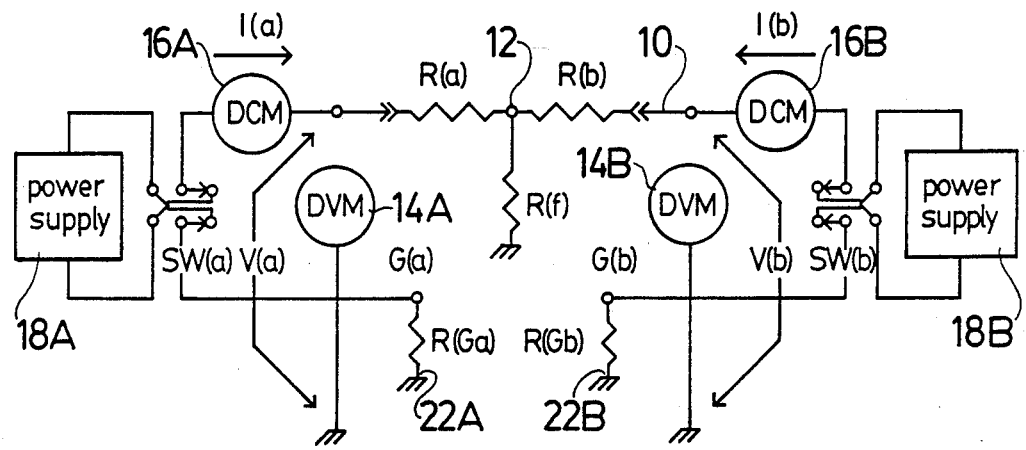
FIG. 1 shows a basic measurement circuit according to the invention.

Referring to the drawings, FIG. 1 illustrates the basic measurement circuit, connected to a conductor 10 faulted to ground at 12. A digital voltmeter 14A, current meter 16A, DC power supply 18A, switching mechanism SW(a) and earth ground reference G(a) are connected to end A of the faulted conductor. Similarly, digital voltmeter 14B, current meter 16B, DC power supply 18B, switching mechanism SW(b) and earth ground reference G(b) are connected to end B of the conductor. The conductor resistances from the fault point 12 to the ends A and B of the conductor are R(a) and R(b) respectively. The fault resistance is R(f). The resistances of ground points G(a) and G(b) are R(Ga) and R(Gb) respectively.

When an electrical potential (bias voltage) is applied, with respect to earth, to one end A of a faulted conductor, current flows through the conductor to the fault and through adjacent conductors or directly into the surrounding earth. If the opposite end B of the conductor is electrically open, no current flows in the second section of the conductor. The voltage V(b) at the end B of the cable, therefore, equals the voltage V(f) at the fault. Using these values the resistance of the cable section can be calculated from:

$$R(a) = \frac{V(a) - V - (b)}{i(a)}$$

Figure 2:
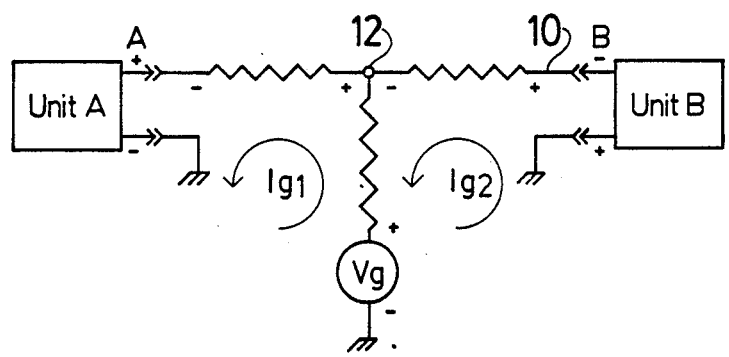
FIG. 2 schematically, ground currents or the like which may impress voltages and/or currents on the faulted conductors.

Where:
V(a) represents the applied line voltage
V(b) represents the voltage at the fault
i(a) represents the line current The measuring current is driven through the ground resistances R(Ga) and R(Gb). The ground resistances are generally unknown and could cause significant measurement error if not accounted for. To avoid this possible error the invention uses reference grounds 22(a) and 22(b) placed outside the voltage gradient area of the local ground G(a) or G(b). The voltage drop and error of the local ground resistance is thereby minimized. In addition to the ground resistances, other influences are often present which could result in measurement error. As illustrated in FIG. 2, external influences such as electro-chemical processes often impress voltages Vg and ground currents I(g1) and I(g2) and on the faulted conductors. To neutralize the errors that would result from these external influences, the switching mechanisms SW(a) and SW(b) are used first to add the influence to and then subtract it from the measurement. The error of these influences is subsequently eliminated in an averaging algorithm which used. The measurement is performed as follows:

1. Power supply 18B is disconnected, power supply 18A is connected to end A of conductor 10, via switch SW(a), with the conductor positive.
2. At a precise point in time, after the voltages and currents have stabilized, the readings of V(a), V(b), and i(a) are measured simultaneously.
3. Switch SW(a) is thrown to make the conductor negative and step 2 is repeated.
4. Steps 2 and 3 are repeated until the average of (V(a)−V(b))/i(a) is known within a given statistical certainty.
5. Power supply 18A is disconnected. Power supply 18B is connected to end B of conductor 10 via switch SW(b) with the conductor positive.
6. Steps 2 through 4 are repeated for determining V(b), V(a) and 1(b). The conductor resistance to the fault can then be determined as follows:

$$R(a) + \frac{1}{N} \sum_{i=1}^{N} (V(ai) - V(bi))/i(ai) \quad (1)$$

$$R(b) + \frac{1}{N} \sum_{i=1}^{N} (V(bi) - V(ai))/i(bi) \quad (2)$$

Where
N is the number of measurements that were taken during the test routine at each end of the conductor.

Using the conductor resistance calculations, the distance to the fault is computed $$D(a) = D(t) R(a)/(R(a)+R(b)) \quad (3)$$

and $$D(b) = D(t) R(b)/(R(a)+R(b)) \quad (4)$$

where

D(a) is the distance from end A to the fault.
D(b) is the distance from end B to the fault.
D(t) is the total distance of the cable from point A to B.

The calculation assumes that the conductor resistance per unit length of cable is constant.

Alternately, if the conductor resistance per unit length is known, the distance to the conductor fault may be computed by $$D(a) = R(a)/R(n) \quad (5)$$

$$D(b) = R(b)/R(n) \quad (6)$$

where
R(n) is the characteristic resistance of the conductor in ohms per unit length.

The procedure outlined above represents the basic concepts of the fault location process. As mentioned, it is important that when data is recorded at opposite ends of the cable under test that the measurements occur simultaneously. Therefore, communication between the opposite ends of the conductor under test is required.

In order to achieve the required accuracy, timing and communication, a computer based automated high resistance fault locator has been developed. The locator is designed to determine the location of a single fault in the outer jacket of a cable containing at least one metallic shield, armor or conductor. A "fault" is a breakdown of the electrically insulating outer jacket due to mechanical or other failure causing a small electrical leakage path (high resistance) to the surrounding soil or to one or more adjacent conductors.

The locator does not require the use of a separate dedicated conductor pair. Instead, the system uses an earth reference technique specifically developed for this application. Communication between the ends of the cable is carried out on the conductor under test. Use of a conductor other than those used for communications signals allows the detection of cable faults before service interruption and allows testing while the cable is in service. Identical locator units are used at each end of the cable under test.

Figure 3:
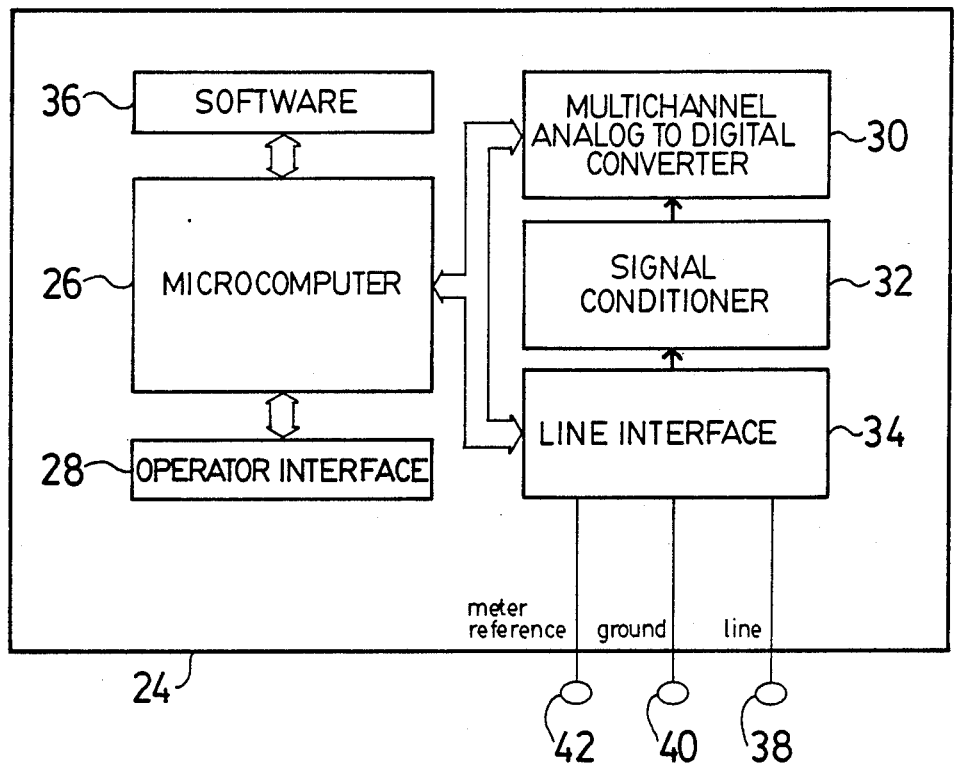
FIG. 3 is a block diagram of a control unit.

Referring to FIG. 3, each locator unit 24 consists of a microcomputer 26 with an operator interface 28. The interface is a data display and keyboard. The computer 26 is connected to a multichannel analog to digital converter 30, a signal conditioner 32 and a line interface 34. A custom software program 36 operates the test sequence and displays the data results. External connections are to the conductor under test at line connection 38, to ground at 40, and to a meter reference at 42.

Figure 4:
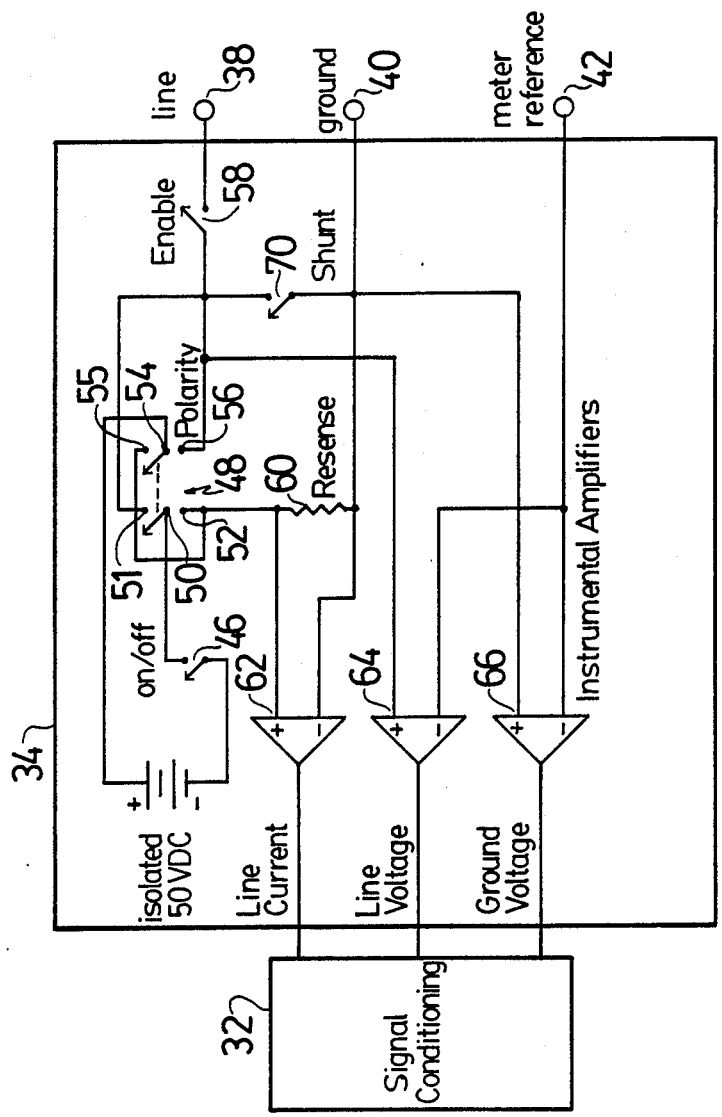
FIG. 4 is a schematic of a line interface included in the control unit.

FIG. 4 is a schematic representation of the line interface component of a locator unit. The line interface includes the isolated 50 volt DC power supply 18 which is connected, through an on/off switch 46 to a polarity of reversing switch 48. The reversing switch is a double pole-double throw switch with one throw 50 connected to the negative terminal of the power supply through the on/off switch 46. The throw 50 connects with either terminal 51 or terminal 52. The other throw 54 is connected to the positive terminal of the power supply 18 and connects with either terminal 55 or terminal 56 of the switch.

The terminals 51 and 56 are connected through enable switch 58 to to the line connector 38 of the locator unit. The terminals 42 and 45 are connected, through a resistor 60 to the ground terminal 40 of the unit. Thus, with the enable switch closed and terminals 41 and 45 engaged, the line terminal 38 is at a negative potential with respect to the ground terminal 40. With the switch terminals 42 and 46 engaged, the line terminal 38 is positive with respect to the ground terminal 40.

An amplifier 62 is connected in parallel across the resistor 60 and serves to provide a signal representing the line current in the circuit between the line and ground terminals 38 and 40. A line voltage amplifier 64 is connected to the upstream side of the enable switch 58 and to the meter reference terminal 42 to produce a signal representing the voltage between the line terminal 38 and the meter reference terminal 42. This equates to the voltage V(a) of FIG. 1.

A further amplifier 66 is connected between the ground terminal 40 and the meter reference terminal 42 and generates a signal representing the voltage between those two terminals. The outputs from the three amplifiers are passed to the signal conditioner 32 of the locator unit.

A shunt switch 70 is connected across the line and ground terminals 38 and 40.

Figure 5:
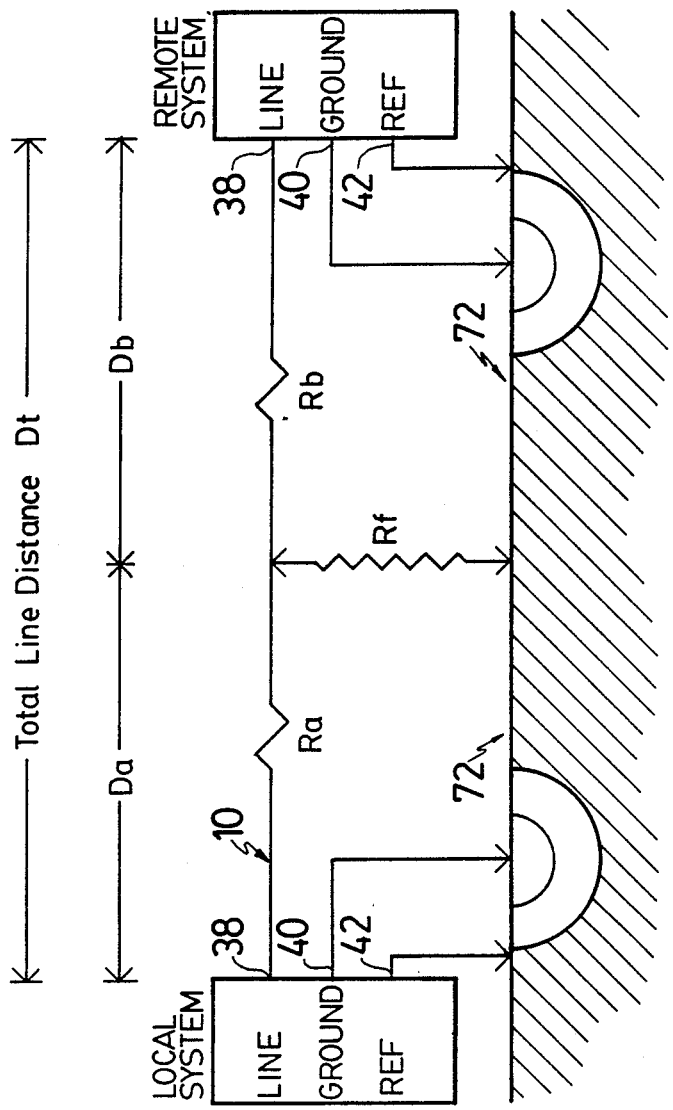
FIG. 5 is a schematic representation of the ground connections of the system.

To carry out a test using the apparatus, two locator units are connected to opposite ends of a cable conductor to be tested as shown in FIG. 5. Tests can be initiated from either end of the conductor. The end at which the test is initiated is termed either "local" or "master", while the opposite end is the "remote" or "slave" unit.

There are a number of external connections of each locator unit to be made before a test. The quality of these connections affects the accuracy of the fault location process With continued reference to FIG. 5, the bias voltage is applied between the line connector 38 and the ground connector 40. The line connection is a direct electrical connection to the metallic conductor under test. The ground connection is the return path from the actual fault through the ground or local ground connections. The test current flows between these two points. The resistance of the ground connection should be as low as possible. The use of an existing large format grounding structure, for example water pipes or an existing ground system is preferred.

The third connection is the meter reference connection 42. The meter reference is a dedicated ground outside of any ground potential field 72 that may be generated by the primary ground. The meter reference ground does not require a low impedance as does the primary ground, but should be held as low as practical to ensure a noise free reference. No other connections are made to this ground.

The distance that the meter reference must be from the main ground connections to ensure that the meter reference is outside of any ground potential fields 72 is dependent on the conductivity of the soil and the resistance of the main ground termination. Typical values will be 50 to 150 feet.

Where a fault exists between two conductors and both are available at each end of the cable, the locator units may be connected with the ground connectors 40 and the reference connectors 42 coupled to the respective ends of the second conductor, so that the second conductor serves as the ground reference.

Communication between the two units uses the same hardware and connections as the main test routines. Commands and data are first converted into a binary codes. The coding is transmitted by applying the test potential to the conductor being tested and then alternating the applied polarity in accordance with the binary code. Data is recovered by using the main metering channel of the analog to digital converter. The data is then processed by the microcomputer. The use of a high level signal, very low data transmission rate and advanced processing of the received data ensures minimum error rates and reliable communication under severe conditions.

The software program controls the microcomputer, actuates the analog sub-system circuits, performs the required measurement sequence and calculates the results. Once the test is initialized (full test), several steps occur automatically without further operator interaction. Configuration data values must also be input to the microcomputer including the total line length (D(t)) and the line resistance (in ohms per kilometer).

Figure 6:
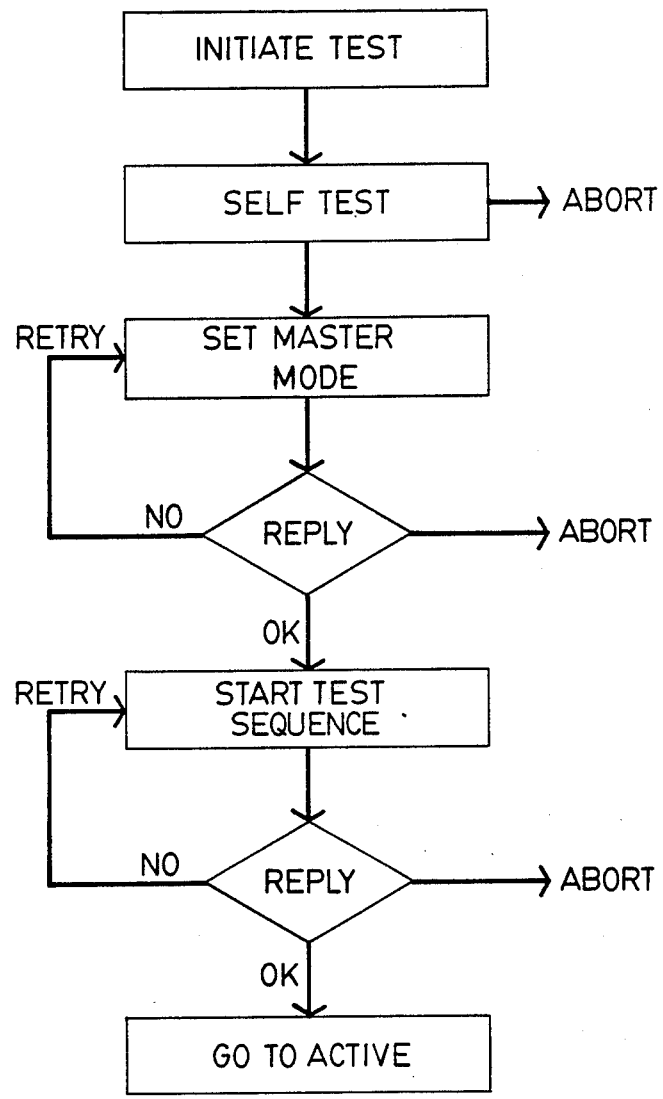
FIGS. 6, 7 and 8 are flow charts depicting the operational sequences of the system.
Figure 7:
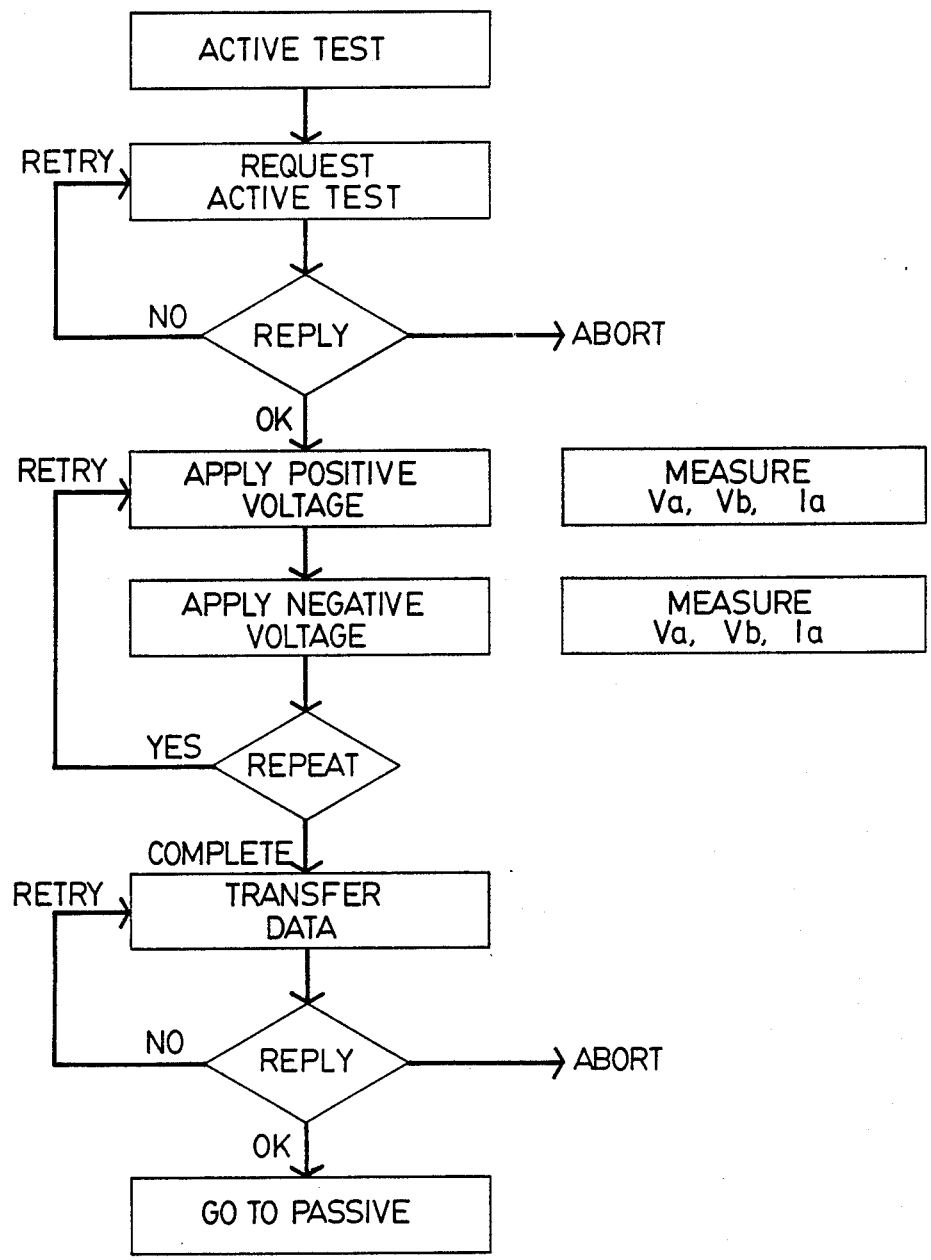
Figure 8:
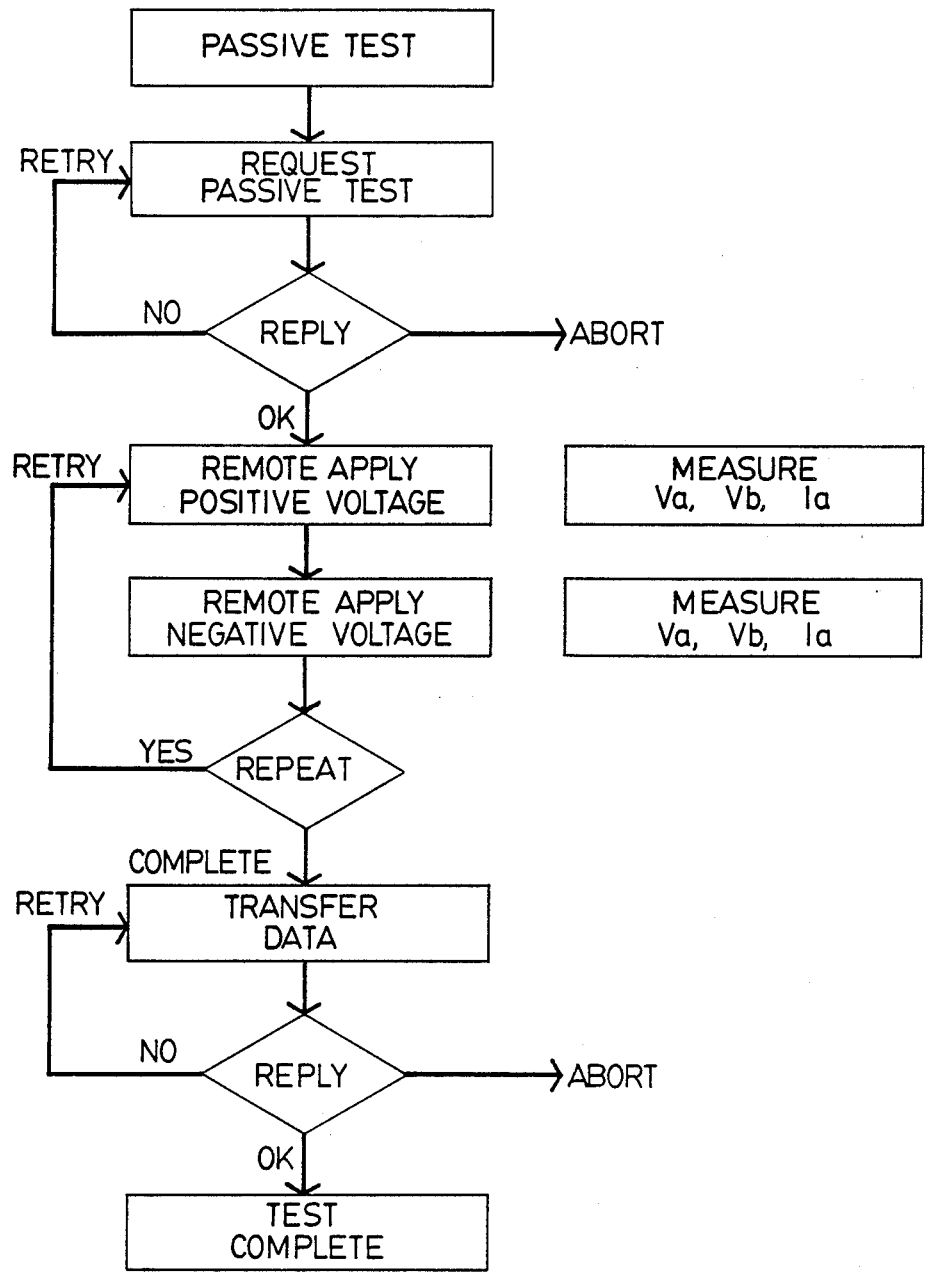

Prior to actual testing, the system performs a self test according to the flow chart in FIG. 6. In addition to monitoring internal microcomputer functions, this test also measures local and remote ground voltages for excessive levels. If this test is passed, the unit at which the test has been initiated requests that it be identified as the master and the remote system as the slave. Once these steps are concluded the program proceeds to active testing according to FIG. 7.

The active test is the test sequence which determines the value of R(a). When the active is requested, the number of test samples is transmitted by the master and agreed to by the slave. When the test begins, the microcomputers base their timing on the last data signal transmitted. From this point to the end of the active test, the events are carefully timed to insure simultaneous measurements.

The test procedure begins with a preconditioning step in which a negative polarity is applied briefly before the first positive sample. When the first positive value is applied both microcomputers measure and record the line voltage (V(a) at the master and V(b) at the slave) and the line current (i(a) at the master).

The polarity is then reversed and the same values, V(a), V(b) and i(a), are measured and recorded. Each voltage measurement is with respect to the meter reference connection, while the current is that which flows in the line connection.

After the required number of test cycles, the system enters the data transfer mode. All data values recorded by the slave system are transmitted back to the master. After completion of this phase the passive test mode is entered.

The passive test is similar to the active test with the exception that the slave system applies the voltage to the line under test and measures and records the line current. Values measured and recorded include V(a), V(b) and i(b). At the successful conclusion of this test sequence the recorded data is transmitted from the slave to the master.

When all data is received by the Master, the microcomputer calculates the values for R(a) and R(b), R(f), and D(a) and D(b) based on the configuration value of D(t). This data is then displayed and also recorded in permanent data file.

The accuracy of the fault location is influenced by many parameters. Assuming quality grounds and a homogenous conductor, the accuracy of the location is related to the accuracy of the metering times the ratio of the resistance of the fault to the line resistance in ohms per unit distance. Given a metering accuracy of 0.05% (0.0005), a fault resistance of 20,000 ohms and a line resistance of 20 ohms per km, the resulting error would be:

$$\begin{aligned}\text{Error} &= 0.0005 \times 20{,}000/20 \\ &= 0.0005 \times 1000 \\ &= 0.5 \text{ km}\end{aligned}$$

The addition of several other factors, such as the quality of the grounds and influences due to electrical noise or voltage offsets present on the faulted line, will, degrade the results. Slight variations in the line resistance throughout its length will effect the results directly.

Since these effects will represent a percentage of the total line length, subsequent testing over a shorter span (slightly before and after the predicted fault location for example) will increase the ability to predict the exact fault location.

While one embodiment of the present invention has been described in the foregoing, it is to be understood that other embodiments are possible within the scope of the present invention. The invention is therefore to be considered limited solely by the scope of the appended claims.

We claim:

1. A method of locating a resistive fault between first and second ends of an electrical conductor, comprising:
   (a) applying a DC voltage with respect to ground to the first end of the conductor;
   (b) measuring the steady state DC voltage with respect to ground and current at the first end of the conductor and substantially simultaneously measuring the steady state DC voltage with respect to ground at the second end of the conductor;
   (c) applying a DC voltage with respect to ground to the second end of the conductor;
   (d) measuring the steady state DC voltage with respect to ground and current at the second end of the conductor and substantially simultaneously measuring the steady state DC voltage with respect to ground at the first end of the conductor;
   (e) computing from the measured voltages and currents the resistance of the conductor between the resistive fault and at least one end of the conductor; and
   (f) computing the distance between the resistive fault and at least one end of the conductor from the computed conductor resistance.

2. A method according to claim 1 wherein the DC voltages are applied to the conductor with respect to first ground connections and the steady state DC voltages are measured with respect to second, independent ground connections.

3. A method according to claim 2 wherein the resistance of the conductor between the resistive faults at each end of the conductor is computed using the algorithms:

$$R(a) = [V(a) - V(b)]/i(a)$$

$$R(b) = [V(b) - V(a)]/i(b)$$

where
R(a) is the conductor resistance between the first end and the fault;
R(b) is the conductor resistance between the second end and the fault;
(V)a is the DC voltage at the first end;
(V)b is the DC voltage at the second end;
i(a) is the DC current at the first end; and
i(b) is the DC current at the second end.

4. A method according to claim 3 wherein the distance is computed using at least one of the algorithms:

$$D(a) = R(a)/R(n)$$
$$D(b) = R(b)/R(n)$$

where
D(a) is the distance from the first end to the fault;
D(b) is the distance from the second end to the fault;
D(t) is the total length of the conductor between the first and second ends;
R(n) is the resistance of the conductor per unit length.

5. A method according to claim 3 wherein the distance is computed using at least one of the algorithms:

$$D(a) = D(t)\,(R(a)/R(a) + R(b))$$
$$D(b) = D(t)\,(R(b)/R(a) + R(b))$$

where
D(a) is the distance from the first end to the fault;
D(b) is the distance from the second end to the fault;
D(t) is the total length of the conductor between the first and second ends.

6. A method according to claim 1 including repeating steps (a) and (b) a plurality of times, one half with an applied DC voltage of positive polarity and the other half within applied DC voltage of negative polarity, repeating steps (c) and (d) a plurality of times, one half with an applied DC voltage of positive polarity and the other half with an applied DC voltage of negative polarity, and wherein the computing steps comprise computing a plurality of values of conductor resistance from the fault to each end of the conductor, averaging the values of resistance from the fault to each end to provide averaged conductor resistances, and computing the distance between the fault and at least one of the first and second conductor ends from the average conductor resistances.

7. An apparatus for locating resistive fault between first and second ends of an electrical conductor, comprising:
   a first power supply for applying a DC voltage with respect to a first ground connection to the first end of the conductor;
   first voltage metering means for measuring the DC voltage with respect to a second ground connection of the conductor at the first end;
   first current metering means for measuring the current in the conductor at the first end;
   a second power supply for applying a DC voltage with respect to a third ground connection to the second end of the conductor;
   second voltage metering means for measuring the DC voltage with respect to a second ground connection of the conductor, at the second end;
   second current metering mean for measuring the current in the conductor at the second end; and
   calculating means operatively connected to the metering means for calculating from voltages and currents measured thereby, the resistance of the conductor between each end thereof and a fault therein, and for calculating the distance along the conductor from at lease one end of the conductor to the fault.

8. An apparatus according to claim 7 including control means for controlling operation of the first and second power supplies, the first and second voltage metering means, the first and second current measuring means and the calculating means.

9. An apparatus according to claim 8 wherein the control means include switch means for selectively applying positive and negative DC voltages from the first and second power supplies to the conductor.

10. An apparatus according to claim 9 wherein the control means include first and second control units for connection to the first and second ends of the conductor.

11. An apparatus according to claim 10 wherein each control unit comprises means for sending signals to and means for receiving signals from the other control unit.

12. An apparatus according to claim 11 wherein the means for sending and receiving signals comprise means for sending and receiving the signals on the conductor.

13. An apparatus according to claim 12 wherein the means for sending signals comprise means for controlling the switch means for selectively reversing the polarity of the DC voltage applied to the conductor, thereby generating a binary signal 14. An apparatus according to claim 11 wherein the control means include means for causing the first control unit to apply a DC voltage to the first end of the cable and then to measure the steady state DC voltage and current at the first end, and causing the second control unit to measure the steady state DC voltage at the second end substantially simultaneously with measurement of the voltage and current at the first end; and means for causing the second control unit to apply a DC voltage to the second end of the conductor and then to measure the steady state DC voltage and current at the second end, and causing the first control unit to measure the steady state DC voltage at the first end substantially simultaneously with measurement of the voltage and current at the second end.

15. An apparatus according to claim 14 wherein at least one of the said control units includes means for applying signals representing measured voltages an currents to the conductor, and the other said control unit includes means for receiving and processing the signals.

* * * * *

UNITED STATES PATENT AND TRADEMARK OFFICE
CERTIFICATE OF CORRECTION

PATENT NO. : 4,947,469

DATED : August 7, 1990

INVENTOR(S) : David E. Vokey, Kenneth N. Sontag, John C. Chamberlain, Ronald L. Lavallee It is certified that error appears in the above-identified patent and that said Letters Patent is hereby corrected as shown below:

COLUMN 3, LINE 52

In equation "(1)", after "R(a)", replace "+" with -- = --;
line 55, in equation "(2)", after "R(b)", replace "+" with
-- = --.

Signed and Sealed this

Third Day of March, 1992

Attest:

HARRY F. MANBECK, JR.

Attesting Officer

Commissioner of Patents and Trademarks